METHOD OF FABRICATION OF PHOTOMASKS

Filed May 8, 1969 2 Sheets-Sheet 1

INVENTOR
Andrew G. F. Dingwall
BY Robert V. Williams
ATTORNEY

METHOD OF FABRICATION OF PHOTOMASKS

Filed May 8, 1969 2 Sheets-Sheet 2

INVENTOR
Andrew G. F. Dingwall
BY Robert P. Williams
ATTORNEY

United States Patent Office 3,673,018

Patented June 27, 1972

3,673,018

METHOD OF FABRICATION OF PHOTOMASKS

Andrew G. F. Dingwall, Somerville, N.J., assignor to RCA Corporation

Filed May 8, 1969, Ser. No. 823,051
Int. Cl. C23f *1/02*
U.S. Cl. 156—11 3 Claims

ABSTRACT OF THE DISCLOSURE

A photomask has multilayer opaque patterns on a transparent substrate. Each pattern includes a bottom layer and a top layer, each of a material capable of being etched by a substance which will not etch the substrate, and an intermediate layer of a material capable of being etched by a substance which will not etch the bottom and top layers. The several layers compensate for defects in each layer.

An improved photomask fabrication method includes forming the abovementioned patterns by successively depositing the bottom and intermediate layers, photoetching the intermediate layer into a desired pattern, depositing the top layer, and then photoetching the top and bottom layers into a desired pattern.

BACKGROUND OF THE INVENTION

This invention was made in the course of a contract with the Department of the Air Force. The invention relates to photomasks for use in the contact photographic printing of photoresist patterns on semiconductor wafers and to a method of fabricating such photomasks.

In one method of manufacturing semiconductor devices such as transistors and integrated circuits, a semiconductor wafer is coated with a photosensitive material and a photomask containing an opaque image is placed in contact with the photosensitive coating. A negative of the photo-mask image is then printed onto the wafer by exposing the photosensitive coating to a source of light through the photomask and then developing the coating.

In order to obtain high resolution and faithful image reproduction between the photomask and the photoresist coating on the semiconductor wafer, the surface of the photomask is conventionally pressed firmly against the photosensitive coating. The surface of the photosensitive coating is normally not smooth and the material on the surface of the photomask of which the photomask image is constituted is frequently scratched by this contact. The scratched photomasks must either be repaired before they can be reused or, in many cases, the damage is so extensive that the scratched masks must be discarded. In either event, the damage to the photomask caused by surface scratching thereof gives rise to a significant expense in the manufacture of semiconductor devices.

So-called chrome photomasks have been used in an effort to avoid the problems set forth in the foregoing paragraph. These photomasks consist of a transparent substrate of glass with a pattern of chromium metal on a surface thereof. The chormium pattern is formed by photolithographic techniques from a photographic reduction of a handmade drawing of the desired pattern, known as "master." Because of the hardness of the chromium metal, these masks are less easily damaged than prior non-metallic masks.

A problem with prior chrome masks has been that they have been subject to significant errors because of pinholes in the chromium film, formed when the film is deposited, and because of defects which stem from defects in the photoresist coating used to form the pattern. It is generally known that pinhole-type errors can be avoided by depositing two independent opaque layers on a substrate and then defining the pattern by photolithography. The statistical probability that pinholes are in alignment in each of two superimposed layers is remote, and consequently, double layer films are relatively impermeable to light. While the double layer technique effectively eliminates pinhole defects, it cannot correct defects produced during the final etching of the pattern, since both layers are affected equally in this step.

Another form of error-compensated photomask employs independent opaque images on opposite sides of an intermediate transparent substrate or deposited film. Here, the images are formed independently and both deposition defects and etching defects are effectively eliminated. These masks have been substantially better than prior masks but have not been as free from defects as are the present masks. In some, the two images are misaligned. In those in which the intermediate layer is a deposited film, the film often has not been sufficiently transparent in the regions between the opaque image areas.

SUMMARY OF THE INVENTION

The present novel photomask includes a transparent substrate having a pattern of opaque multilayer elements of predetermined shape on a surface thereof. The opaque elements are each made up of a first layer of a material which can be etched by a substance which will not etch the substrate, a second layer which can be etched by a substance which will not etch the first layer, and a third layer of a material which can be etched by a substance which will also etch the first layer. The multilayer structure effectively cancels pinhole type errors and the intermediate layer protects the first layer during a final pattern-forming etching step to correct for defects produced by that step.

A novel method of fabricating photomasks includes the steps of forming the pattern of the intermediate second layer in a photoetching step separate and distinct from that used to form the pattern of the first and third layers. The patterns may be formed independently from different masters so that the probability of defects being repeated at the same place in each of the two layers is extremely small.

THE DRAWINGS

THE PREFERRED EMBODIMENT

Figure 1:
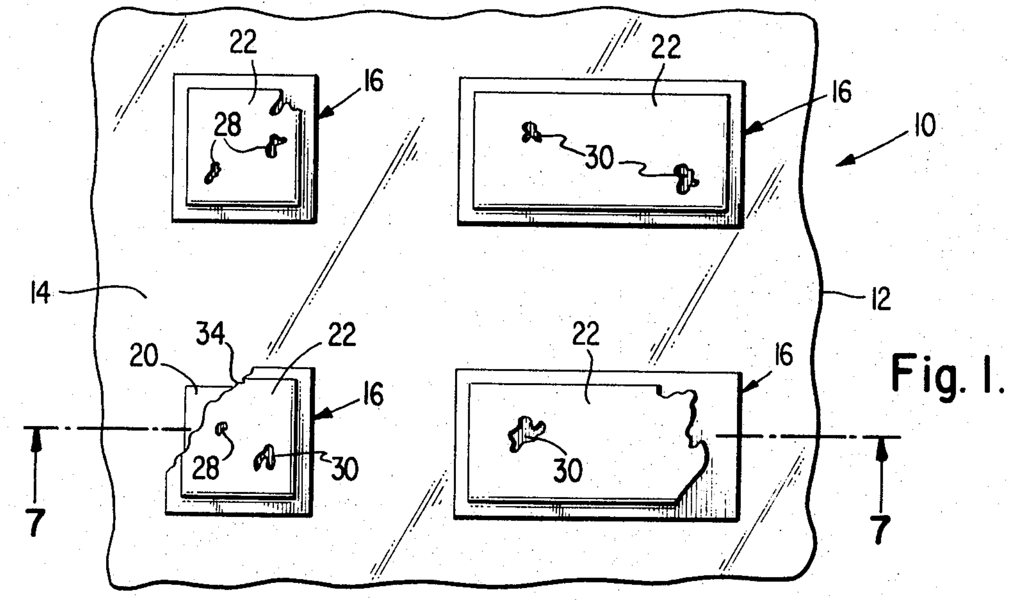
FIG. 1 is a partial plan view of the present photomask, showing in grossly exaggerated fashion certain defects therein.

The present photomask, designated generally throughout the drawings by the reference numeral 10, includes a body 12 of transparent material such as glass which has a flat surface 14 thereon. Disposed on and adherent to the surface 14 is a pattern of opaque material, the elements of which are each indicated generally by the numeral 16. The elements 16 of the pattern may take any shape or size as dictated by the semiconductor device to be fabricated with a particular mask 10. For convenience, simple rectilinear shapes are shown, but in practice the elements 16 usually have relatively complex shapes.

Each of the elements 16 of the pattern has a three layer structure including a first layer 18, a second or intermediate layer 20 and a third layer 22. The second layer 20 has the same shape as the first and third layers but is slightly smaller, that is, its edges are spaced inwardly from the edges of the first and third layers. This feature increases the tolerance for misalignment between the second layer and the other layers, as will appear more fully in the discussion below of the fabrication process.

The material selected for the first layer 18 should be adherent to the material of the substrate 12 and should be capable of being etched by a substance to which the material of the substrate 12 is inert. A suitable material for the layer 18 is chromium. The intermediate layer 20 should be adherent to the material of the layer 18 and should be capable of being etched by a substance to which the material of the layer 18, and the layer 22, is inert. Suitable materials for the intermediate layer 20 are copper and silicon dioxide. The requirements for the material of the top layer 22 are similar to those of the bottom layer 18. In addition, the top layer 22 should be relatively hard and abrasion resistant. Consequently, chromium is a suitable material for the top layer 22 as well as the bottom layer 18.

Some of the defects which may appear in the present photomask and which are effectively eliminated by its construction are illustrated in exaggerated form in the drawings. For example, any of the three layers 18, 20 and 22 may have pinhole defects therein as represented at 24, 26, and 28, respectively. Pinhole defects are defects of relatively small lateral extent which extend entirely through the respective layer. The several layers may also have major holes too large to be called pinholes, as indicated at 30 in the layer 22. The intermediate layer 20 may have edge defects such as that shown at 32. Likewise, the top layer 22 may have such defects, one of which is indicated at 34. Undesired extra material may remain on the surface 14 as indicated at 35 in FIG. 5. These latter defects are not always objectionable, and they may be easily removed from the mask if desired.

The total effect of all of the defects described in the foregoing paragraphs is negligible in the present structure. The probability that pinholes or even major holes will coincide in the three layers is minimal. The intermediate layer 20 will protect the underlying portions of the layer 18 and thus will prevent a gross etching error in the top layer 22 from being reflected in the lower layer 18. The size of the intermediate layer 20, while it should preferably be less than the desired pattern by a small amount as mentioned above, should be sufficiently close to the size of the desired pattern that the difference is negligible. Furthermore, defects such as that at 32 in the intermediate layer 20 are corrected by the combination of the layers 18 and 22.

Figure 2:
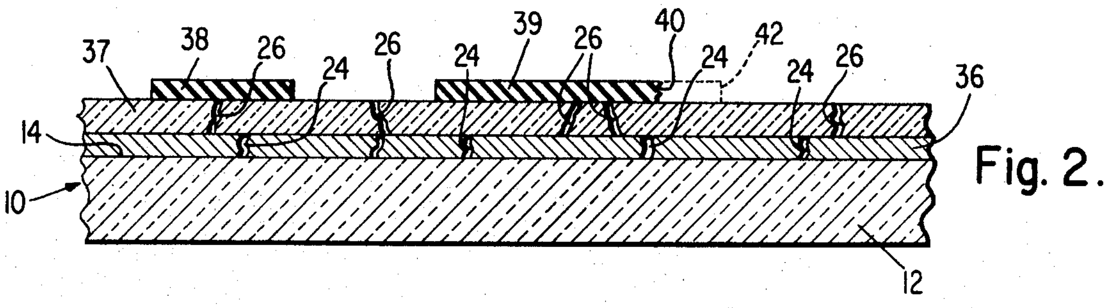

FIGS. 2 to 7 illustrate various steps in the fabrication of the present novel photomasks. FIG. 2 illustrates an early stage in the fabrication in which the substrate 12 has a deposited coating 36, portions of which will become the first layers 18 of the elements 16, on the surface 14 of the body 12. The coating 36 may have pinholes as indicated at 24. On the coating 36 is a deposited coating 37, of a material such as silicon dioxide, portions of which will become the second layers 20 of the elements 16. The coating 37 may also have pinholes, as indicated at 26. Two bodies 38 and 39 of etch resistant material are disposed on the coating 20 and define the desired shape, size, and location of the elements 16 in the final finished mask. For purposes of illustration, the body 39 is shown with a gross defect at the right edge 40 thereof, where a portion of the material intended to be present, indicated by the phantom line 42, is absent from the body 39. The bodies 38 and 39 may be formed in any known manner, as from a suitable master by photolithographic techniques, for example.

The structure as shown in FIG. 2 is subjected to an etching treatment to remove those portions of the coating 37 which are not protected by the resist bodies 38 and 39. The substance used to remove the undesired portions of the coating 37 is one to which the material of the coating 36 is inert, and may be, if the layer 37 is $SiO_2$ for example, a mixture of 4 parts of an ammonium fluoride solution (8 parts by wt. $NH_4$ to 15 parts by wt. deionized water) and 1 part concentrated HF solution.

Figure 3:
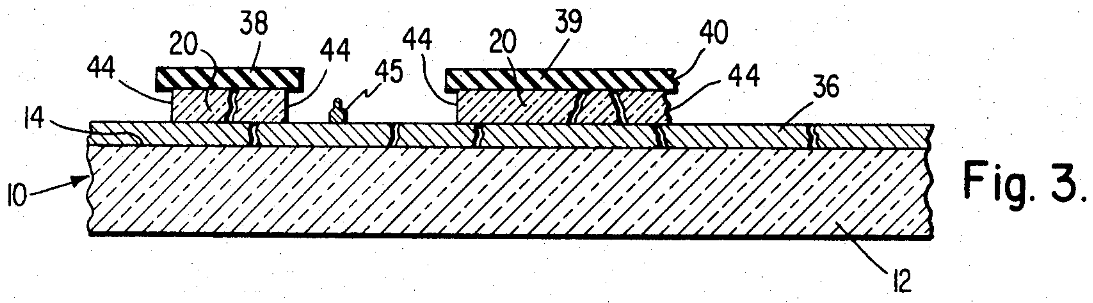

After this etching step is completed, the structure is as shown in FIG. 3. Here, the resist bodies 38 and 39 are shown superposed over the remaining protected portions of the coating 37, i.e., the layers 20. The size of the layers 20 is made less than the size of the desired pattern, preferably by overetching the coating 37, that is, by subjecting it to the etching treatment for a time longer than is necessary to remove the undesired portions. Accordingly, the layers 20 are shown in FIG. 3 as having edges 44 which are indented under the corresponding edges of the resist bodies 38 and 39. At the right side of the body 39, the underlying layer 20 reflects the error in the position of the edge 40 thereof.

Sometimes, all of the undesired portions of the coating 37 are not removed and small portions thereof remain between the desired portions, as suggested by the portion 45 in FIG. 3.

The resist bodies 38 and 39 are next removed by dissolving them in a suitable solvent. The next step in the fabrication process is to deposit a coating 46, portions of which will become the third layers 22 of the elements 16 (see FIG. 4).

Figure 4:
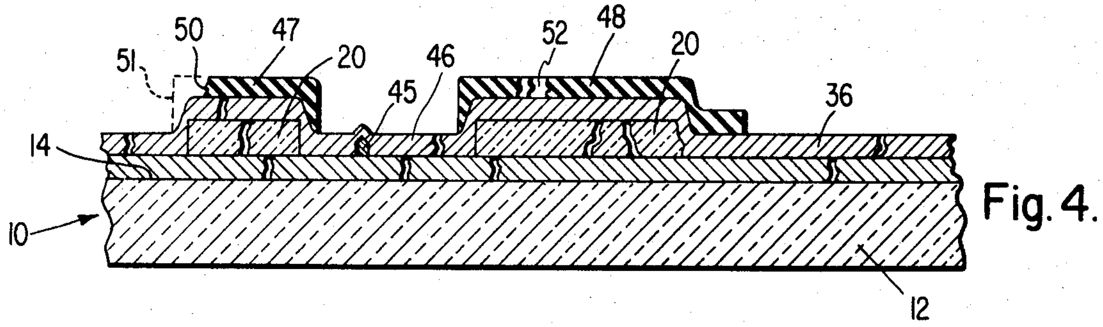

Then, a new resist pattern is formed on the coating 46 as as indicated by the bodies 47 and 48 in FIG. 4. The bodies 47 and 48 are preferably formed photolithographically from a master different from the one used to form the original resist bodies 38 and 39. In this way, any defects which are present in the two masters are not likely to be repeated at the same location. The resist bodies 47 and 48 may have defects, however, and two such defects are illustrated in FIG. 4. As shown, the body 47 has an improperly located left boundary 50 and is lacking a portion indicated by the phantom line 51. The body 48 has a large hole 52 therein.

Figure 5:
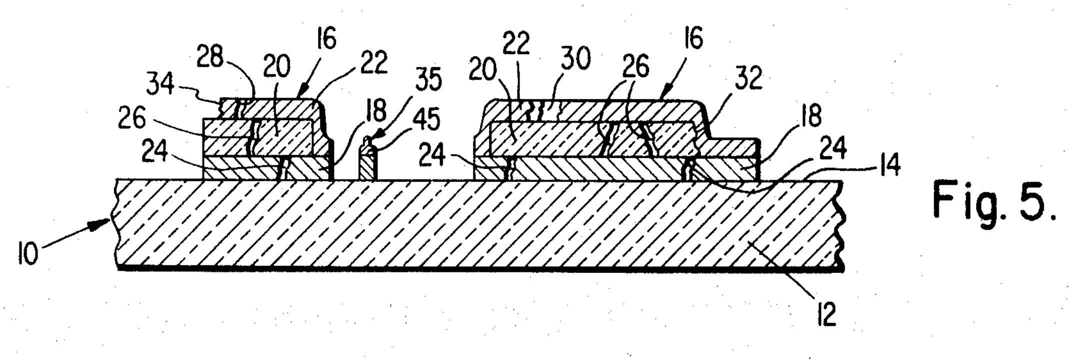

The device 10 as illustrated in FIG. 4 is subjected to an etching treatment in a solvent for the material of the layers 36 and 46. For chromium, an etching solution of 25 gm. potassium hydroxide, 50 gm. potassium ferricyanide in 500 cc. distilled water is suitable for this purpose. FIG. 5 shows the mask 10 after this etching step and after the removal of the resist bodies 47 and 48. The hole 52 in the resist body 48 allows the etching solution to attack the layer 22 and produce the defect represented at 30. The missing portion of the resist body 47 allows the solution to remove the left edge portions of the layers 22 and 18. The intermediate layer 20, however, acts as a mask to protect the lower layer 18 and thus produces a pattern which is accurate in shape but just slightly smaller than the desired pattern. Note the pattern element 16 at the lower left corner of FIG. 1 in which the second layer 20 protrudes from beneath the layer 22.

The master used to form the resist bodies 47 and 48 may not be exactly aligned with respect to the layers 20 and differences in spacing between individual elements of the master may result in misalignments between the layers 22 and the layer 20 in individual elements 16 of the mask 10. The slight reduction in lateral size of the elements 20, however, increases the probability that the areas of the layers 20 are wholly within the areas of the layers 22. Consequently, while the total area of a pattern element 16 may be slightly smaller than is desired, it is not likely to be larger. The distance between elements 16 is often critical and a smaller area, and thus a greater spacing, is usually preferred. The small portion 45 of the coating 37 between the pattern elements 16 protects the underlying material of the coating 18 and thus produces the defect 35.

The mask 10 in the form shown in FIG. 5 is useful for many applications. Ordinarily, defects such as the extra material at 35 are insignificant. The remaining "extra chrome spot" defects 35 are easily eliminated on processed silicon wafers by means of a double exposure technique with the mask 10. In a typical double photoresist exposure application, a composite image is formed on negative photoresist by exposure from two independent mask images (obtained by stepping over one row for each exposure) on the mask 10. Since extra chrome spot defects will be unlikely to coincide in independent images, the second exposure on a statistical basis will expose the photoresist in those areas previously unexposed due to extra chrome spot defects without at the same time introducing further defects due to pinhole-type defects on the mask. In this important respect, the present masks are superior to conventional masks which normally contain both missing and excess pattern type defects. Here, use of the same double easily applied photoresist exposure technique does not provide a systematic procedure for improving mask perfection. Although excess pattern defects would be reduced, mask pinhole and missing pattern type defects would be doubled.

Figure 6:
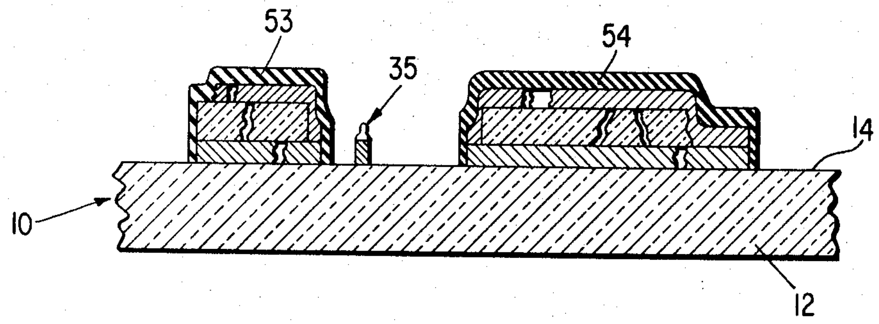
FIGS. 2 to 7 are cross-sectional views based generally on the line 7—7 of FIG. 1 illustrating sequentially several steps in the fabrication of this photomask.
Figure 7:
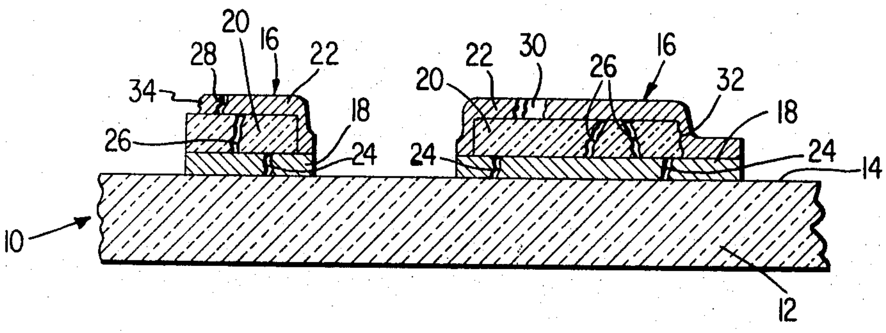

For high precision work, however, it is desirable to remove even the extra chrome spot defects 35. FIGS. 6 and 7 illustrate how this may be done by a third photoetching step. As shown in FIG. 6, a third pattern including bodies 53 and 54 of photoresist material is formed on the mask. This then leaves the defect 35 exposed and it may be removed by subjecting the device to a solvent for the material of the coating 36. The finished mask 10, after the removal of the resist bodies 53 and 54, appears in FIGS. 1 and 7.

I claim:

1. A method of making a photomask for use in the contact photographic printing of photoresist pattern comprising the steps of:

applying to a surface of a transparent body a first coating of an opaque material which is capable of being etched by a substance to which the material of said body is inert, applying to said first coating a second coating of a different material which is capable of being etched by a substance to which the material of said first coating is inert, selectively etching said second coating to leave portions of said second coating on said first coating in a predetermined pattern, applying over said portions of said second coating and the exposed portions of said first coating a third coating of a material which is capable of being etched by a substance which will also etch the material of said first coating, and selectively etching said first coating and said third coating to leave a pattern corresponding to said photoresist pattern.

2. A method as defined in claim 1 wherein said etching of said second coating is carried out by applying etch resistant material to said second coating in a pattern corresponding to said photoresist pattern and etching said second coating for a time sufficient to remove material which underlies edge portions of said etch resistant material whereby said predetermined pattern of portions of said second coating is smaller in lateral extent than said photoresist pattern.

3. A method of making a photomask for use in the contact photographic printing of photoresist patterns comprising the steps of:

applying to a surface of a transparent body a first coating of an opaque material which is capable of being etched by a substance to which the material of said body is inert, applying to said first coating a second coating of a material which is capable of being etched by a substance to which said opaque material is inert, forming a pattern of resist material corresponding to the desired photoresist pattern on said second coating, etching away the portions of said second coating which are not protected by said resist material to leave other portions of said second coating in said desired pattern, removing the resist material from said second coating, applying over said other portions of said second coating and the exposed portions of said first coating a third coating of a material capable of being etched by a substance which will also etch the material of said first coating, applying a second resist pattern corresponding to said desired photoresist pattern to said third coating, and etching away those portions of said third coating and said first coating which are not protected by said second resist pattern.

References Cited

UNITED STATES PATENTS

| | | | |
|---|---|---|---|
| 3,542,551 | 11/1970 | Rice | 96—36.2 |
| 2,731,333 | 5/1954 | Ko et al. | 156—11 |
| 3,192,136 | 6/1965 | Reid | 156—3 |
| 3,330,696 | 7/1967 | Ullery et al. | 117—217 |
| 3,518,084 | 6/1970 | Barson et al. | 96—36.2 |

ROBERT F. BURNETT, Primary Examiner

R. J. ROCHE, Assistant Examiner

U.S. Cl. X.R.

156—3, 24; 95—1; 96—36.2